(12) United States Patent
Uesaka et al.

(10) Patent No.: US 6,833,714 B2
(45) Date of Patent: *Dec. 21, 2004

(54) INQUIRY METHOD OF THE SOURCE WHICH GENERATES ELECTROMAGNETIC WAVE

(75) Inventors: Kouichi Uesaka, Kawasaki (JP); Takashi Suga, Yokohama (JP)

(73) Assignee: Hitachi, Ltd., Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 10/062,928

(22) Filed: Feb. 1, 2002

(65) Prior Publication Data

US 2002/0167324 A1 Nov. 14, 2002

Related U.S. Application Data

(63) Continuation of application No. 09/932,420, filed on Aug. 17, 2001, now Pat. No. 6,697,744.

(30) Foreign Application Priority Data

Mar. 16, 2001 (JP) ........................................ 2001-075364

(51) Int. Cl.[7] .......................... G01R 27/32; G01R 15/00
(52) U.S. Cl. .......................................... 324/638; 702/57
(58) Field of Search ................................ 324/638, 627, 324/628, 637, 647, 765, 95; 343/703; 702/57

(56) References Cited

U.S. PATENT DOCUMENTS

| 4,052,666 A | * | 10/1977 | Fletcher et al. ............. 324/643 |
| 5,650,935 A | | 7/1997 | Nishino et al. |
| 6,281,697 B1 | * | 8/2001 | Masuda et al. ............. 324/765 |
| 6,289,290 B1 | * | 9/2001 | Lee et al. ..................... 702/57 |
| 6,411,104 B1 | | 6/2002 | Uesaka et al. |
| 2002/0158640 A1 | * | 10/2002 | Uesaka et al. ............. 324/638 |

FOREIGN PATENT DOCUMENTS

| JP | 11-142453 | 5/1999 |
| WO | WO 00/65362 | 11/2000 |

* cited by examiner

*Primary Examiner*—Albert Decady
*Assistant Examiner*—James Kerveros
(74) *Attorney, Agent, or Firm*—Townsend and Townsend and Crew LLP

(57) ABSTRACT

A recording medium includes a computer readable program for controlling a computer. The program comprises (a) code for calculating a current distribution by using a strength and phase of magnetic field measured from a measuring object; (b) code for calculating a first electric field strength at a measuring point from the current distribution; (c) code for calculating a second electric field strength at the measuring point by using a current distribution of a predetermined position on a part of the current distribution of the measuring object; and (d) code for calculating a ratio related to the first electric field strength in association with the second electric field strength.

9 Claims, 12 Drawing Sheets

FIG. 7 x DIRECTION

| Hx[dB] | 0 | 1 | 2 | 3 | 4 | ... | 30 |
|---|---|---|---|---|---|---|---|
| 0 | 28.47 | 29.13 | 29.76 | 30.35 | 30.88 | ... | 27.62 |
| 1 | 29.32 | 30.05 | 30.75 | 31.4 | 32 | ... | 28.38 |
| 2 | 3019 | 31 | 31.77 | 32.51 | 33.18 | ... | 29.17 |
| 3 | 31.09 | 31.98 | 32.84 | 33.67 | 34.44 | ... | 29.96 |
| 4 | 32 | 32.99 | 33.96 | 34.9 | 35.78 | ... | 30.76 |
| ... | ... | ... | ... | ... | ... | ... | ... |
| 20 | 28.75 | 29.44 | 30.09 | 30.69 | 31.25 | ... | 27.87 | y DIRECTION

FIG. 8 x DIRECTION

| Ix [mA] | 0 | 1 | 2 | 3 | 4 | ... | 30 |
|---|---|---|---|---|---|---|---|
| 0 | 0 | 0 | 0 | 0 | 0 | ... | 0 |
| 1 | 0 | 0.5 | 18.4 | 2.1 | 0 | ... | 0 |
| 2 | 0 | 13.1 | 25.9 | 8.3 | 5.0 | ... | 0 |
| 3 | 0.2 | 16.2 | 31.5 | 13.2 | 8.0 | ... | 0 |
| 4 | 11.3 | 18.0 | 36.0 | 17.3 | 10.2 | ... | 0 |
| ... | ... | ... | ... | ... | ... | ... | ... |
| 20 | 0 | 0 | 0 | 0 | 0 | ... | 0 | y DIRECTION

FIG. 9

| ANGLE | EΦ | Eθxz | Eθyz |
|---|---|---|---|
| 0 | 48.73 | 46.35 | 48.70 |
| 5 | 48.69 | 45.55 | 48.67 |
| 10 | 48.59 | 45.43 | 48.56 |
| 15 | 48.42 | 44.32 | 48.39 |
| 20 | 48.17 | 42.23 | 48.15 |
| 25 | 47.85 | 42.10 | 47.83 |
| 30 | 47.45 | 42.34 | 47.44 |
| 35 | 46.96 | 43.30 | 46.95 |
| 40 | 46.38 | 43.85 | 46.37 |
| 45 | 45.67 | 45.02 | 45.67 |
| 50 | 44.84 | 45.26 | 44.85 |
| ... | ... | ... | ... |
| ... | ... | ... | ... |
| 350 | 48.60 | 46.33 | 48.58 |
| 355 | 48.70 | 46.34 | 48.67 |
| 360 | 48.73 | 46.35 | 48.70 |

INQUIRY METHOD OF THE SOURCE WHICH GENERATES ELECTROMAGNETIC WAVE

BACKGROUND OF THE INVENTION

1. Field of the Invention

The present invention is related to a technique capable of inquiring a source for generating an electromagnetic wave.

2. Description of the Related Art

Conventionally, while a magnetic field in the vicinity of either an electronic circuit board or an electronic appliance, which constitute an object to be measured, is measured, it is so predicted that such a current flows at a position where a strength of this vicinity magnetic field is high, and this current constitutes a source of generating a remote (far-distant) electric field.

In the conventional predicting method, there is such a probability that even such a current may be detected, and this current does not constitute a source of generating a remote electric field.

For instance, in the case that while two current elements (remote electric field generating sources) having two phases opposite to each other are present on an object to be measured, an interval "d" between these two current elements is longer than a distance "1" defined from the measuring object to a measurement point of the vicinity magnetic field, and also is sufficiently smaller than a wavelength thereof "λ", electric fields generated from both the two current elements may be canceled with each other, and thus, these electric fields may not constitute a major factor of such a remote electric field. However, in the related art predicting method, these currents may be detected as such a current which constitutes the source for generating the remote electric field.

There is a similar case even when currents having opposite phases to each other do not appear. That is, there is such a case that electric fields radiated to the space may have opposite phases to each other in view of a relationship of intervals of current sources.

In addition, in the conventional predicting method for predicting that the current flowing at the position where the strength of the vicinity magnetic field is high may constitute the major factor for generating the electric field at the remote place, the following problems occur. That is, since the value of the electric field strength at the remote place is undefinite, the conventional predicting method cannot judge as to whether or not this value of the remote magnetic field strength actually exceeds the controlled value. Also, even when the measure is taken as to the current flowing at the position where the strength of this vicinity magnetic field, the conventional predicting method cannot judge as to whether the electric field strength at the remote place is increased, or decreased.

In other words, the conventional predicting method cannot give such a clear definition. That is, in the current distribution over either the electronic circuit board or the electronic appliance, which constitute the measuring object, this conventional predicting method cannot clarify that a current flowing through which point may constitute the major factor for generating the remote electric field.

Also, the conventional predicting method cannot give a clear definition such that how the remote electric field is changed by the variation in the currents flowing at an arbitrary point.

SUMMARY OF THE INVENTION

An object of the present invention is made to solve these problems, and therefore, to provide such an electromagnetic wave generating source searching method capable of easily judging a source for generating a remote electric field, to which a measure should be taken.

To achieve such an object, an electromagnetic wave generating source searching method, according to an aspect of the present invention, is featured by that a calculation is made of a contributing rate which constitutes a remote electric field of each of current sources (namely, magnetic field generating sources) having an investigation object, and then, the calculated contributing rate is displayed. Concretely speaking, all of remote electric fields are measured, or calculated, which are caused by all of currents flowing over either an electronic circuit board or an electronic appliance, which constitute an object to be measured. Then, a calculation is made of a difference between the remote electric field and an electric field caused by each of currents flowing over either the electronic circuit board or the electronic appliance, which constitute the measuring object. Thus, another calculation is made of a contributing rate of a current which generates a remote electric field at this point.

Also, an electronic wave generating source searching method, according to a further aspect of the present invention, is featured as follows: That is, since a current distribution is multiplied by a coefficient so as to obtain a remote electric field, it is possible to predict a change in remote electric fields in such a case that a current flowing over either the electronic circuit board or the electronic appliance, which constitute the measuring object, is changed.

As a consequence, this electromagnetic wave generating source searching method can clarify such a fact that a current flowing at which point may constitute a factor for generating the remote electric field within the current distribution over either the electronic circuit board or the electronic appliance, which constitute the measuring object. Also, this electromagnetic wave generating source searching method can clarify such a fact that how the remote electric field is changed in response to the change in the currents flowing at the arbitrary point. As a consequence, this electromagnetic wave generating source searching method can readily judge the electric field generating source to which the measure should be taken.

BRIEF DESCRIPTION OF THE DRAWINGS

For a better understanding of the present invention, reference is made of a detailed description to be read in conjunction with the accompanying drawings, in which:

FIG. 7 represents a data format of a magnetic field measurement result;

FIG. 8 shows a data format of a current distribution searching result;

FIG. 9 indicates a data format of an electric field calculation result;

DETAILED DESCRIPTION OF THE EMBODIMENTS

Figure 2:
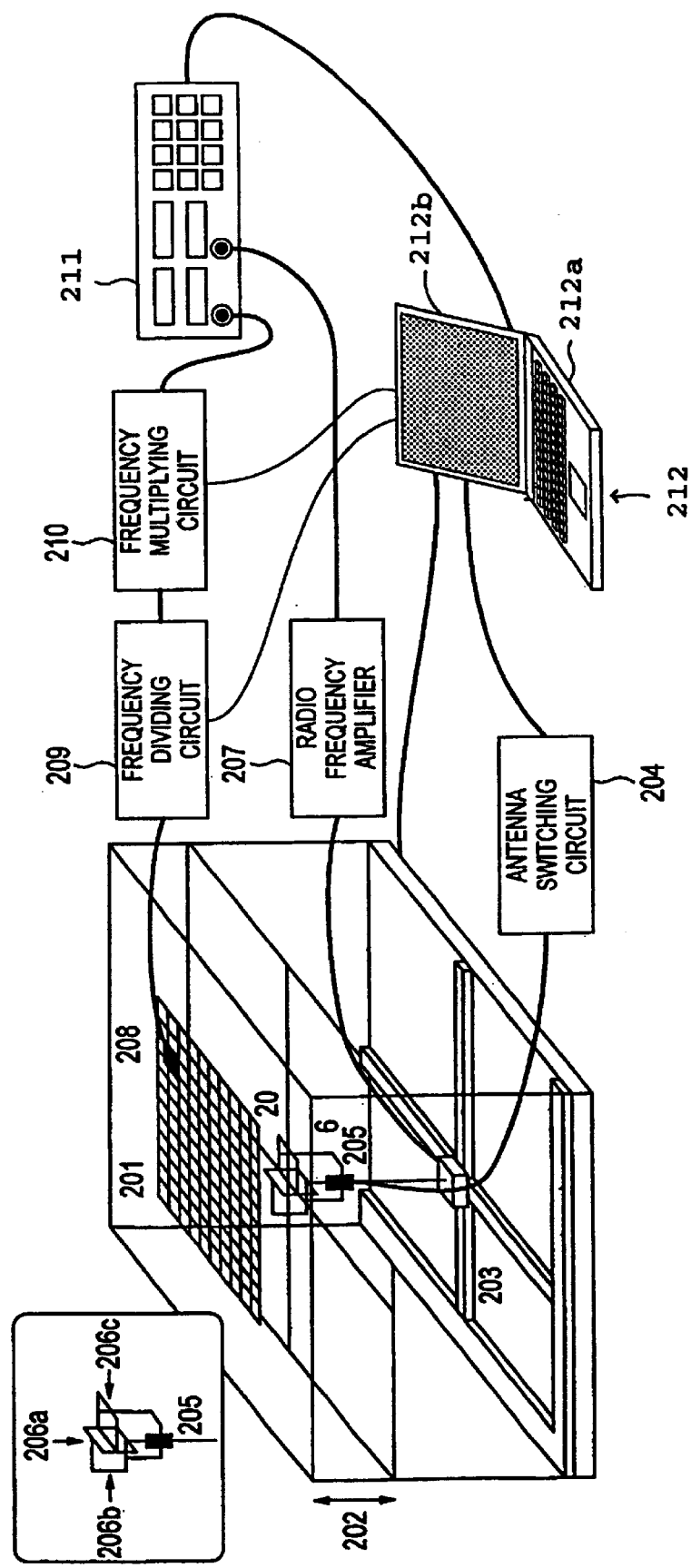
FIG. 2 is a schematic diagram for indicating an arrangement of an unwanted (spurious) electromagnetic wave generating source inquiring (searching) apparatus.

FIG. 2 schematically shows an arrangement of such an apparatus for measuring a magnetic field distribution of an object to be measured, for calculating a current distribution in this measuring object based upon the measurement result of the magnetic field distribution, and also for calculating a remote electric field distributing rate with respect to the current distribution by employing the current distribution calculation result.

With respect to an arrangement of such a measuring apparatus, since an adverse influence of a mirror image is caused by a direct searching (inquiring) type measuring apparatus, a main body of this direct searching type measuring apparatus is separated from an object to be measured so as to reduce this adverse influence. Then, an only small-sized magnetic probe is extended from the main body of the measuring apparatus to the object to be measured in order to carry out a direct searching measurement. This small-sized magnetic field probe substantially does not disturb a magnetic probe.

An unwanted (spurious) electromagnetic wave generating source searching (inquiring) apparatus indicated in this drawing is provided with a three-dimensional magnetic field probe 206, an antenna switching switch 205, an antenna switching circuit 204, a radio frequency (high frequency) amplifier 207, a probe 208, a frequency dividing circuit 209, a frequency multiplying circuit 210, a vector voltage meter 211, a computer 212, a storage apparatus 212a, and also a display apparatus 212b.

The three-dimensional magnetic field probe 206 is formed by employing a probe 206a for detecting an x-directional magnetic field, a probe 206b for detecting a y-directional magnetic field, and a probe 206c for detecting a z-directional magnetic field in an integral form so as to detect a magnetic field of an object 201 to be measured. Both the antenna switching switch 205 and the antenna switching circuit 204 are used to selectively switch the probe 206a for detecting the x-directional magnetic field, the probe 206b for detecting the y-directional magnetic field, and the probe 206c for detecting the z-directional magnetic field. The radio frequency amplifier 207 amplifies a detection signal derived from the three-dimensional magnetic field probe 206. The probe 208 is used to extract a reference clock signal in order to acquire a phase of a magnetic field. Both the frequency dividing circuit 209 and the frequency multiplying circuit 210 are employed so as to convert a frequency of the reference clock signal into a desirable frequency of a reference clock signal. The vector voltage meter 211 is used to measure a voltage which is induced by a magnetic field interlinking the magnetic probe 206, while containing a phase shift of the induced voltage with respect to the reference clock signal. The computer 212 is equipped with a CPU, a memory, and the like. The storage apparatus 212a stores thereinto a program and the like, which are used to calculate a remote (far-distant) electric field distributing rate. The display apparatus 212b is used to display a calculation output result and the like. It should be noted that the storage apparatus 212a may be realized by, for instance, such a storage medium for storing thereinto a program and data, and by a storage medium reading apparatus for reading these program and data.

In this spurious electromagnetic wave generating source searching apparatus, at a point of a distance 202 which is electromagnetically located in the vicinity of the measuring object 201, a magnetic field generated from the measuring object 201 is measured by the three-dimensional magnetic probe 206 which is arranged by combining the x-directional magnetic field probe 206a, the y-directional magnetic field probe 206b, and the z-directional magnetic field probe 206c with each other. The three-dimensional magnetic probe 206 is constructed of, for example, three sets of loop antennas 206a, 206b, and 206c. In this case, a distance which is electromagnetically located in the vicinity of the measuring object 201 indicates such a numeral range of a distance "r" which may satisfy a condition of $(2\pi r/\lambda) \leq 1$.

The voltages induced by the vicinity magnetic field which is detected by the three-dimensional magnetic field probe 206 are amplified by the radio frequency amplifier 207 with respect to each of the xyz-directional components, and then, the amplified voltages are supplied to the vector voltage meter 211. On the other hand, an operation clock of the measuring object 201 is detected by the probe 208, and the detected operation clock is frequency-divided by the frequency dividing circuit 209 so as to extract a desirable frequency component, if necessary. The frequency-divided operation clock is frequency-multiplied by the frequency multiplying circuit 210, and thereafter, the frequency-multiplied operation clock is applied as a phase reference to the vector voltage meter 211.

The vector voltage meter 211 receives the magnetic field measurement signals detected by the three-dimensional magnetic field probe 206, and also the operation clock signal derived from the frequency multiplying circuit 210, and separates/extracts information as to a magnitude of each of the measured magnetic fields, and information as to a phase of each of the measured magnetic fields with respect to each component of the respective directions.

The signals indicative of the magnitudes and the phases of this measured vicinity magnetic field are read by the computer 212 which is employed so as to execute both the control of the measuring operation and the calculation of the measuring operation.

Also, the computer 212 supplies a signal to a stage 203 in order to determine a position of the three-dimensional probe 206, and to select the respective directional components of the magnetic field probe via the antenna switching circuit. This computer 212 separately controls the frequency dividing circuit 209 and the frequency multiplying circuit 210 so as to convert the frequency of the reference clock of the measuring object 201 into a desirable frequency, and also controls the vector voltage meter 211 to read the measurement data. As a result, the computer 212 is capable of measuring a three-dimensional vicinity magnetic field with respect to a radio frequency (high frequency) component of the operation clock of the measuring subject 201 by storing the above-explained various information as to the measured magnitudes and phases of the vicinity magnetic field.

Furthermore, while the three-dimensional magnetic field measurement value obtained in the above-described manner is employed, the computer 210 count-calculates a current distribution functioning as an electromagnetic wave generating source with respect to the measuring object 201 based upon a calculation method (will be explained in detail). Then, the computer 210 calculates a remote (far-distance) electric field distribution and a remote (far-distance) electric field contributing rate based upon this calculated current distribution, and outputs the calculation results to the output apparatus 212b. It should also be noted that although the reference clock extracting probe 208, the frequency dividing circuit 209 and the frequency multiplying circuit 210 are employed so as to derive the operation clock frequency of the measuring object 201 and convert this clock frequency into the desirable frequency, these circuits are not always required. Instead of these circuit arrangements, for example, such an alternative arrangement may be employed which uses a signal generator and the like, capable of scanning a frequency range to be measured.

Figure 3:
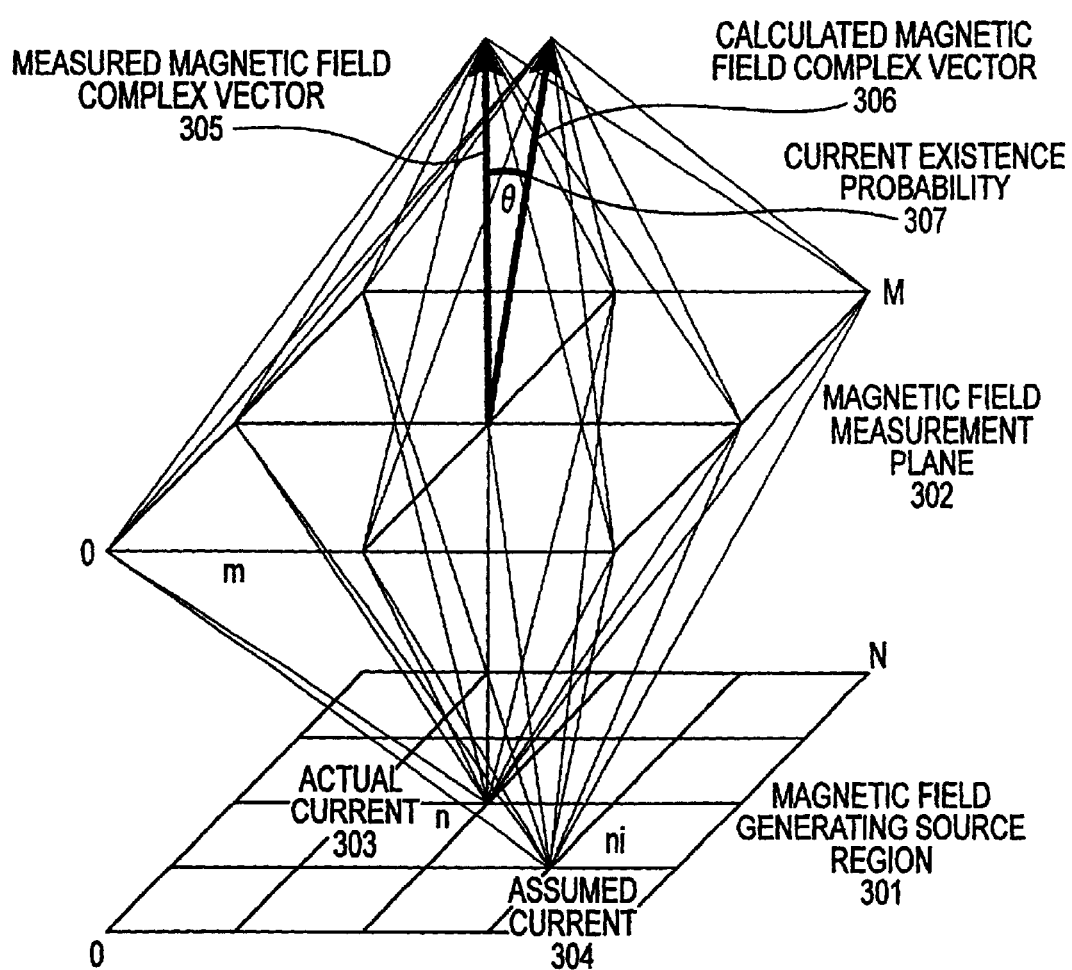
FIG. 3 shows a conceptional diagram for explaining a searching method of a superiors electromagnetic wave generating source.
Figure 4:
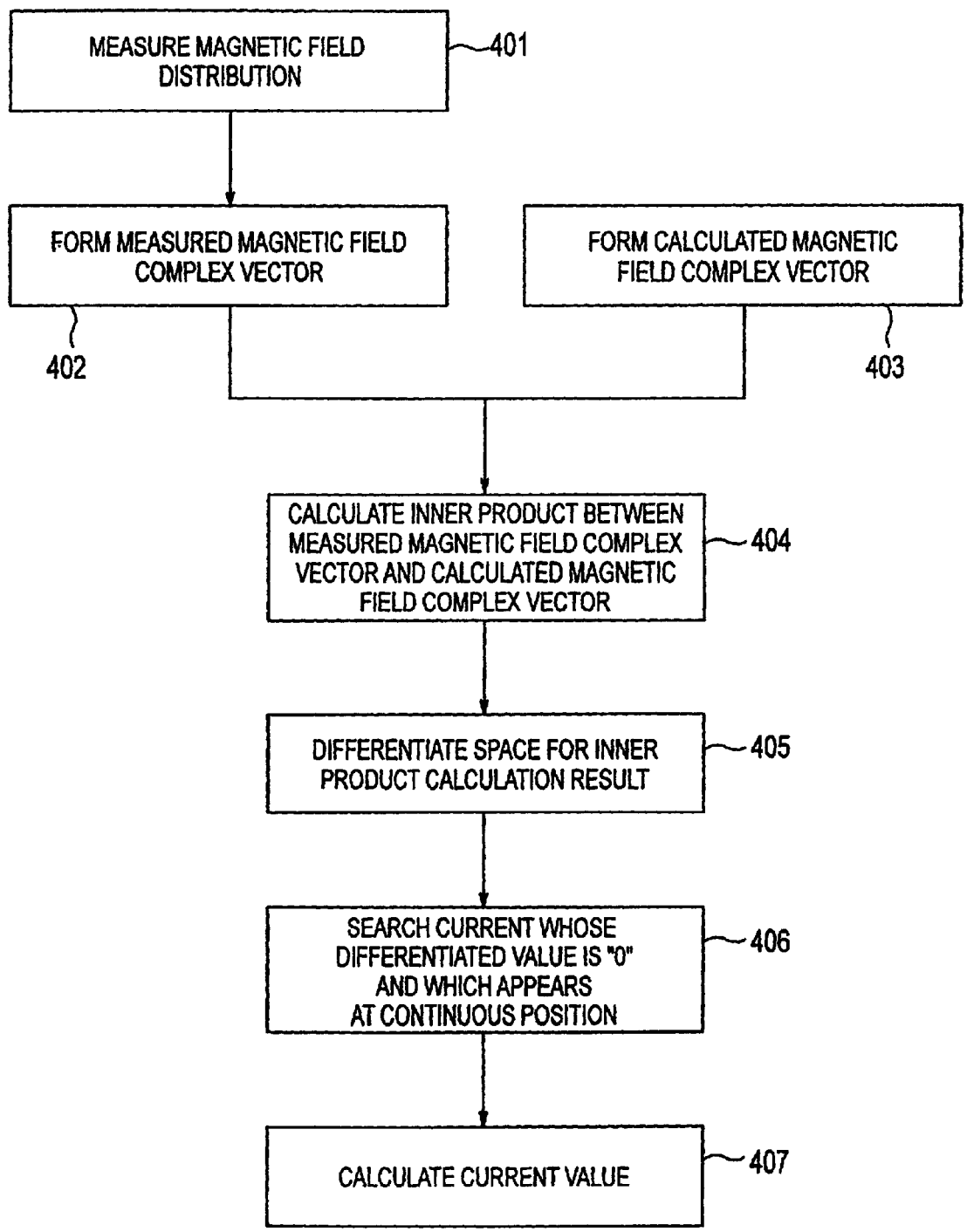
FIG. 4 is a flow chart for describing a searching operation of a superiors electromagnetic wave generating source.

Referring now to FIG. 3 and FIG. 4, a description will be made of an example of a count-calculation process operation (searching process operation) by which a current distribution corresponding to an electromagnetic wave generating source may be count-calculated based upon a magnetic field measurement value. This searching process operation has been described more in detail in JP-A-11-142453 field by the Applicant. This searching process operation corresponds to such a method for capable of calculating current elements and an entire current distribution by executing a pattern matching operation between a magnetic field distribution generated from an assumed current element and a measured magnetic field distribution.

FIG. 3 illustratively shows a conceptional diagram of an analysis, and FIG. 4 is a flow chart for describing an overall process operation of this searching process operation. It should be understood that this searching process operation may be realized by such a manner that a spurious electromagnetic wave generating source searching program is executed by the CPU of the computer 212, and this spurious electromagnetic wave generating source searching program is previously stored into the storage apparatus 212a of the spurious electromagnetic wave generating source searching apparatus of FIG. 2.

In this searching process operation, first of all, a measurement of a vicinity magnetic field is carried out at each of "M" pieces of grid points "m" on a two-dimensional measurement plane 302 which is subdivided as indicated in FIG. 3 (step 401). In this example, while a circuit board and the like on which various electronic devices are mounted is supposed as the measuring object 201, it is so assumed that all of magnetic field generating sources are located on a two-dimensional plane (namely, magnetic field generating source region 301) positioned in parallel to an x-y plane. A measurement result is stored into either the memory of the computer 210 or the storage apparatus 210a. FIG. 7 represents an example of a file of data 2 to be stored in this memory, or the storage apparatus 210a.

Next, the measured vicinity magnetic field data is read out from either the memory of the computer 210 or the storage apparatus 210a, the computer 210 calculates a current component in the x-direction, a current component in the y-direction, and a current component in the z-direction, along which this measured vicinity magnetic field is conceived to be generated. In the beginning, in this searching process operation, a y-directional component of the measured vicinity magnetic field is acquired in order to acquire the current component along the x-direction. In this case, when a current which should be acquired as the actual electromagnetic wave generating source is present on a grid point 303 shown in FIG. 3, a distribution of a y-directional component of the vicinity magnetic field measurement value on the measurement plane 302, which is measured by the three-dimensional magnetic probe 206, owns such a dimension equal to a total number of grid points where the vicinity magnetic field measurement is carried out. Also, this distribution of the y-directional component may be expressed as the following complex vector 305. In this complex vector 305, a measurement value obtained at each of the grid points is used as a value of the respective dimensions.

This complex vector will be referred to as a "measured magnetic field synthesized complex vector 305" hereinafter. In this step 402, this measured magnetic field synthesized complex vector 305 is set based upon the measurement data.

In contrast thereto, at a step 403, a calculated magnetic field synthesized complex vector 306 is obtained. This calculated magnetic field synthesized complex vector 306 may be obtained in such a case that the x-directional current is assumed to be at one grid point 304 on the magnetic field generating source region 301. A distribution of a y-directional component of a vicinity magnetic field calculation value, which is produced on the measurement plane 302 by this assumed current, owns such a dimension equal to a total number of grid points where the vicinity magnetic field measurement is carried out. This distribution of the y-directional component may be expressed as a complex vector 306. In this complex vector 306, a calculation value at each of the grid points is used as a value of each of the dimensions. A current existence probability distribution at the grid point 304 on the electromagnetic wave generating source region 301 may be obtained by acquiring current existence probability $\cos \theta$ 307. This current existence probability $\cos \theta$ is obtained by an inner product of these two complex vectors 305 and 306. In accordance with this embodiment mode, while using the same method as the above-explained method, assuming that the currents exist as to the respective grid points which are set by subdividing the electromagnetic wave generating source region 301, the calculated magnetic field synthesized complex vector 306 may be obtained.

Next, an inner product value between the measured magnetic field synthesized complex vector 305 acquired at the above-step 402 and the calculated magnetic field synthesized complex vector 306 acquired at the above-step 403 will be calculated every current assumed at each of the grid points of the electromagnetic wave generating source region 301 (step 404) by employing, for example, the below-mentioned formula 1 and formula 2.

Formula 1 =

$$\begin{cases} Hx_x(m,n) \cdot Ix(n) = 0 \\ Hx_y(m,n) \cdot Iy(n) = \dfrac{Iy(n) \cdot dy}{4\pi r_{mn}}\left(jk + \dfrac{1}{r_{mn}}\right)\cos\theta \cdot e^{jkr_{mn}} = \dfrac{Iy(n) \cdot dy}{4\pi r_{mn}}\left(jk + \dfrac{1}{r_{mn}}\right)\dfrac{z_p - z_x}{r_{mn}} \cdot e^{jkr_{mn}} \\ Hx_z(m,n) \cdot Iz(n) = \dfrac{Iz(n) \cdot dz}{4\pi r_{mn}}\left(jk + \dfrac{1}{r_{mn}}\right)\sin\theta \cdot \sin\phi \cdot e^{-jkr_{mn}} = -\dfrac{Iz(n) \cdot dz}{4\pi r_{mn}}\left(jk + \dfrac{1}{r_{mn}}\right)\dfrac{y_p - y_s}{r_{mn}} \cdot e^{-jkr_{mn}} \\ Hx_x(m,n) \cdot Ix(n) = \dfrac{Ix(n) \cdot dx}{4\pi r_{mn}}\left(jk + \dfrac{1}{r_{mn}}\right)\cos\theta \cdot e^{jkr_{mn}} = -\dfrac{Ix(n) \cdot dx}{4\pi r_{mn}}\left(jk + \dfrac{1}{r_{mn}}\right)\dfrac{z_p - z_x}{r_{mn}} \cdot e^{jkr_{mn}} \\ Hy_y(m,n) \cdot Iy(n) = 0 \\ Hy_z(m,n) \cdot Iz(n) = \dfrac{Iz(n) \cdot dz}{4\pi r_{mn}}\left(jk + \dfrac{1}{r_{mn}}\right)\sin\theta \cdot \cos\phi \cdot e^{jkr_{mn}} = -\dfrac{Iz(n) \cdot dz}{4\pi r_{mn}}\left(jk + \dfrac{1}{r_{mn}}\right)\dfrac{x_p - x_x}{r_{mn}} \cdot e^{jkr_{mn}} \\ Hy_x(m,n) \cdot Ix(n) = \dfrac{Ix(n) \cdot dx}{4\pi r_{mn}}\left(jk + \dfrac{1}{r_{mn}}\right)\sin\theta \cdot \sin\phi \cdot e^{-jkr_{mn}} = -\dfrac{Ix(n) \cdot dx}{4\pi r_{mn}}\left(jk + \dfrac{1}{r_{mn}}\right)\dfrac{y_p - y_s}{r_{mn}} \cdot e^{-jkr_{mn}} \\ Hz_y(m,n) \cdot Iy(n) = \dfrac{Iy(n) \cdot dy}{4\pi r_{mn}}\left(jk + \dfrac{1}{r_{mn}}\right)\sin\theta \cdot \cos\phi \cdot e^{jkr_{mn}} = -\dfrac{Iy(n) \cdot dy}{4\pi r_{mn}}\left(jk + \dfrac{1}{r_{mn}}\right)\dfrac{x_p - x_x}{r_{mn}} \cdot e^{jkr_{mn}} \\ Hz_x(m,n) \cdot Iz(n) = 0 \end{cases}$$

Formula 2 =

$$\begin{cases} \sum_{m1}^{M} Hm_y(m) \cdot Hy_x(m,n') \cdot \sum_{m1}^{M} Hm_x(m) \cdot Hz_x(m,n') = \\ \sum_{m1}^{M}\sum_{n1}^{N} \{Hy_x(m,n) \cdot Ix(n) \cdot Hy_z(m,n') \cdot Hz_x(m,n) \cdot Ix(n) \cdot Hz_x(m,n')\} \\ \sum_{m1}^{M} Hm_x(m) \cdot Hx_y(m,n') \cdot \sum_{m1}^{M} Hm_z(m) \cdot Hz_y(m,n') = \\ \sum_{m1}^{M}\sum_{n1}^{N} \{Hx_y(m,n) \cdot Iy(n) \cdot Hx_y(m,n') \cdot Hz_y(m,n) \cdot Iy(n) \cdot Hz_y(m,n')\} \\ \sum_{m=1}^{M} Hm_x(m) \cdot Hx_z(m,n') \cdot \sum_{m=1}^{M} Hm_y(m) \cdot Hy_z(m,n') = \\ \sum_{m=1}^{M}\sum_{n=1}^{N} \{Hx_z(m,n) \cdot Iz(n) \cdot Hx_z(m,n') \cdot Hy_x(m,n) \cdot Iz(n) \cdot Hy_x(m,n')\} \end{cases}$$

The inner product value obtained in this case may be expressed by such a ratio obtained by dividing a squared z-directional distance between the magnetic field generating source region 301 and the measurement plane 302 by a summed value. The summed value is calculated by adding the squared z-directional distance to a squared distance between such a grid point that a current to be searched is present (for example, grid point 303) and another grid point in which the assumed current is present (for example, grid point 304). In the case that the position of the assumed current is made coincident with the position of the existence current, the calculated inner product value becomes a maximum value. In the case that the position of the assumed current is made substantially equal to the position of the existence current, the calculated inner product value becomes a local maximum value.

In accordance with this embodiment mode, in order to obtain either the maximum value of this inner product value or the local maximum value of this inner product value, the calculated inner product value is differentiated with respect to the space of the electromagnetic wave generating source region 301 (step 405), and then, such a position that the differentiated value is equal to 0 and also is continuous is determined as a position of the actual electromagnetic wave generating source (step 406).

Furthermore, both a magnitude of a current and a phase of this current functioning as the electromagnetic wave generating source existing at this position may be obtained as follows. That is, since the squared cosine is equal to 1 in the inner product value between the measured magnetic field synthesized complex vector 305 and the calculated magnetic field synthesized complex vector 306, the inner product value of both these vectors is divided by the magnitude of the calculated magnetic field synthesized complex vector 306, so that both the magnitude of the current and the phase thereof may be obtained (step 407).

With execution of the above-described process operation, as to the x-direction current component corresponding to the y-direction current component of the vicinity magnetic field measurement value, the information related to the magnitude thereof, the phase thereof, and the position thereof may be acquired. It should also be noted that since a similar process operation is carried out when a vicinity magnetic field of an x-direction component is measured so as to obtain a current component of the y direction, explanations thereof are omitted.

As described above, the current distribution may be calculated from the measured magnetic field distribution. This calculated result is stored in the memory of the computer 212. FIG. 8 shows an example of a data file which is stored in this memory.

It should also be understood that as the method for calculating this current distribution, any types of methods may be employed if these alternative methods may calculate how much current flows each of the grid points. Alternatively, when such a current distribution is calculated, the measured electric field distribution may be used instead of the magnetic field distribution. However, when the measurement sensitivity and the like are considered, such a method for measuring the magnetic field distribution may be preferably employed.

Figure 1:
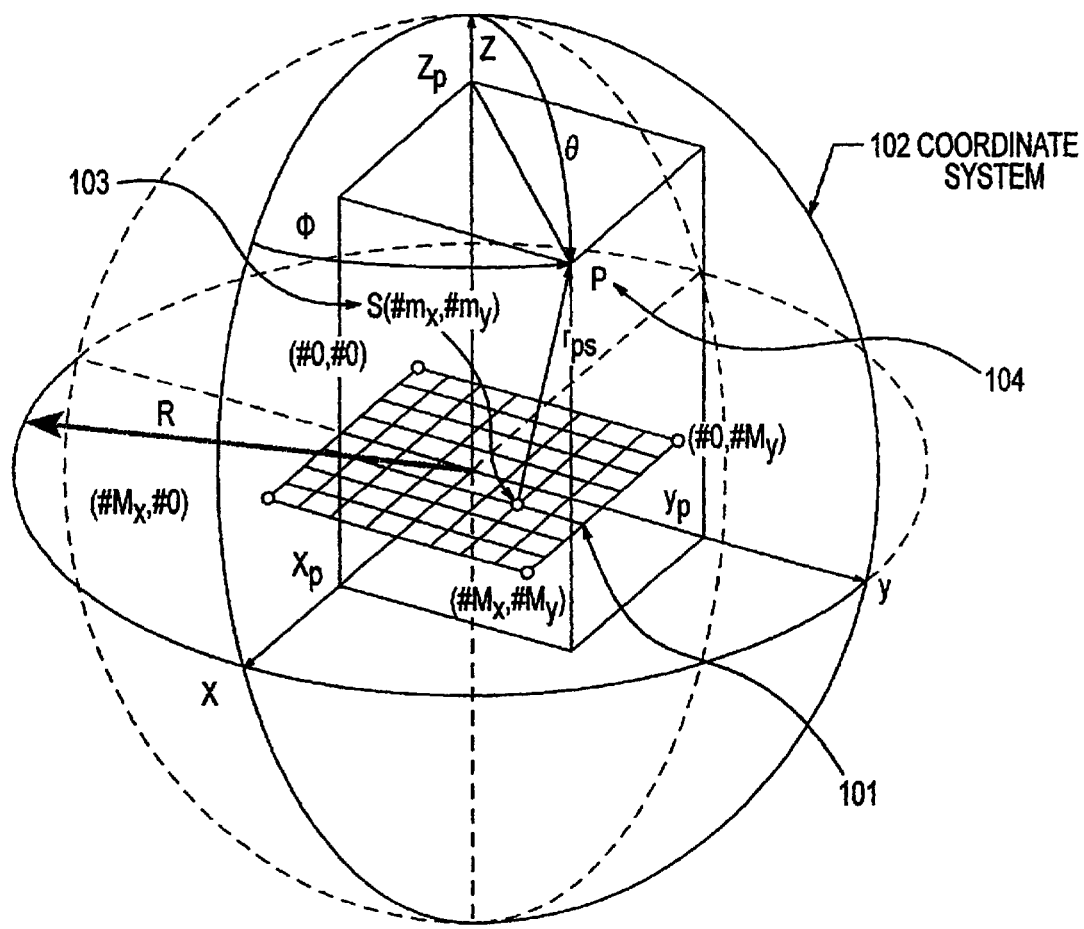
FIG. 1 schematically shows a coordinate system used to acquire both current distributions and remote electric fields of either an electronic circuit board or an electronic appliance, which should be measured.

Next, a description will now be made of such an example that while the current distribution corresponding to these calculation results is employed, a remote (far-distance) electric field distributing rate related to this current distribution is calculated. FIG. 1 is a conceptional diagram of this calculation example of the remote electric field distributing rate. FIG. 1 illustratively represents such a case that either an electronic circuit board or an electronic appliance 101, which correspond to an object to be measured, are present on the plane. In FIG. 1, assuming now that lengths of the respective edges of either the electronic circuit board or the electronic appliance 101 are "Lx" and "Ly", the respective edges are subdivided into "Nx" and "Ny" in such a manner that it becomes a mesh shape made of lengths "dx" and "dy."

Figure 5:
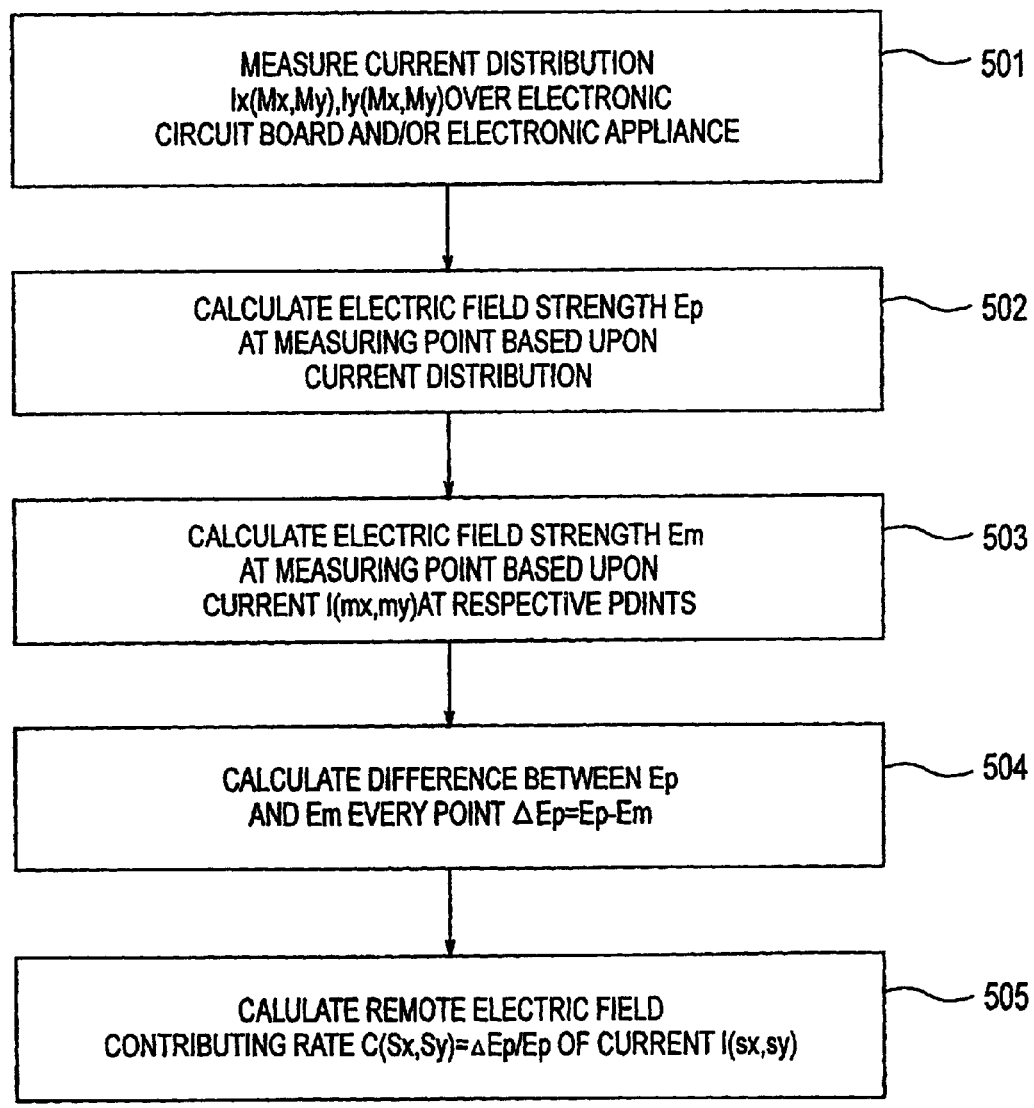
FIG. 5 is a flow chart for explaining a calculation of a remote electric field generation contributing rate.

FIG. 5 is a flow chart for describing a method of calculating a remote electric field contributing rate related to a current distribution which constitutes an object to be measured.

Also, this process operation may be realized by such that the CPU of the computer 212 executes a contributing rate calculation program which has previously been stored in the storage apparatus 212a of the spurious electromagnetic wave generating source searching apparatus shown in FIG. 2.

First, while the above-explained method and the like are employed, when a current distribution in either the electronic circuit board or the electronic appliance 101, which constitute the object to be measured, is measured (step 501), another calculation is made of an electric field strength "Ep" at a measuring point P:104 based upon the calculated current distribution (step 502). In this case, assuming now that such a distance between an existence position S:103 of a current element and an electric field measuring point P (xp, yp, zp):104 is equal to "Rps", an electric field strength "E'" at the measuring point P may be acquired as represented in formula 3, which is caused by a current appeared at the position S:103 on either the electronic circuit board or the electronic appliance, which constitute the measuring object. The existence position S:103 of the current element is located on either the electronic circuit board or the electronic appliance 101, whereas the electric field measuring point P (xp, yp, zp):104 is present on a spherical plane at a desirable distance "R" from a center of either the electronic circuit board or the electronic appliance 101, which constitute the measuring object.

$$\begin{cases} \Delta E_x\{I_x(x_s, y_s)\} = \frac{\eta \cdot I_x(x_s, y_s) \cdot d_x}{4\pi r_{ps}} \left\{ 2\left(\frac{1}{r_{ps}} + \frac{1}{jkr_{ps}^2}\right) \frac{(x_p - x_s)^2}{r_{ps}^2} - \left(jk + \frac{1}{r_{ps}} + \frac{1}{jkr_{ps}^2}\right) \frac{(y_p - y_s)^2 + z_p^2}{r_{ps}^2} \right\} \cdot e^{jkr_{ps}} \\ \Delta E_y\{I_x(x_s, y_s)\} = \frac{\eta \cdot I_x(x_s, y_s) \cdot d_x}{4\pi r_{ps}} \left(jk + \frac{3}{r_{ps}} + \frac{3}{jkr_{ps}^2}\right) \cdot \frac{x_p - x_s}{r_{ps}} \cdot \frac{y_p - y_s}{r_{ps}} \cdot e^{jkr_{ps}} \\ \Delta E_z\{I_x(x_s, y_s)\} = \frac{\eta \cdot I_x(x_s, y_s) \cdot d_x}{4\pi r_{ps}} \left(jk + \frac{3}{r_{ps}} + \frac{3}{jkr_{ps}^2}\right) \cdot \frac{x_p - x_s}{r_{ps}} \cdot \frac{z_p}{r_{ps}} \cdot e^{jkr_{ps}} \end{cases} \quad \text{Formula 3}$$

$$\begin{cases} \Delta E_x\{I_y(x_s, y_s)\} = \frac{\eta \cdot I_y(x_s, y_s) \cdot d_y}{4\pi r_{ps}} \left(jk + \frac{3}{r_{ps}} + \frac{3}{jkr_{ps}^2}\right) \cdot \frac{x_p - x_s}{r_{ps}} \cdot \frac{y_p - y_s}{r_{ps}} \cdot e^{jkr_{ps}} \\ \Delta E_y\{I_y(x_s, y_s)\} = \frac{\eta \cdot I_y(x_s, y_s) \cdot d_y}{4\pi r_{ps}} \left\{ 2\left(\frac{1}{r_{ps}} + \frac{1}{jkr_{ps}^2}\right) \frac{(y_p - y_s)^2}{r_{ps}^2} - \left(jk + \frac{1}{r_{ps}} + \frac{1}{jkr_{ps}^2}\right) \frac{(x_p - x_s)^2 + z_p^2}{r_{ps}^2} \right\} \cdot e^{jkr_{ps}} \\ \Delta E_z\{I_y(x_s, y_s)\} = \frac{\eta \cdot I_y(x_s, y_s) \cdot d_y}{4\pi r_{ps}} \left(jk + \frac{3}{r_{ps}} + \frac{3}{jkr_{ps}^2}\right) \cdot \frac{y_p - y_s}{r_{ps}} \cdot \frac{z_p}{r_{ps}} \cdot e^{jkr_{ps}} \end{cases}$$

Each of cross points "S" (#nx, #ny):103 subdivided as this mesh shape corresponds to the grid point "n" indicated in FIG. 3, and a current value of this cross point "S" is expressed by I (xs, ys). Also, either the electronic circuit board or the electronic appliance 101, which correspond to the measuring object, is located on the coordinate system 102 in such a manner that a center point of either this electronic circuit board or this electronic appliance 101 may constitute an origin of this coordinate system 102.

Then, as represented in formula 4, since all of electric field strengths which are caused by all of the current elements on either the electronic circuit board or the electronic appliance 101, which constitute the measuring object, are calculated to be added to each other, such an electric field strength "Ep" which is produced at the measuring point "P" by either the electronic circuit board or the electronic appliance 101, which constitute the measuring object, may be acquired:

$$\begin{cases} E_x = \sum_{m_x0}^{M_x} \sum_{m_y0}^{M_y} \frac{\eta \cdot e^{-jkr_{\text{ps}}}}{4\pi r_{\text{ps}}} [I_x(x_s, y_s) \cdot d_x \cdot \\ \quad \left\{ 2\left(\frac{1}{r_{\text{ps}}} + \frac{1}{jkr_{\text{ps}}^2}\right) \frac{(x_p - x_s)^2}{r_{\text{ps}}^2} - \left(jk + \frac{1}{r_{\text{ps}}} + \frac{1}{jkr_{\text{ps}}^2}\right) \frac{(y_p - y_s)^2 + z_p^2}{r_{\text{ps}}^2} \right\} + \\ I_y(x_s, y_s) \cdot d_y \cdot \left(jk + \frac{3}{r_{\text{ps}}} + \frac{3}{jkr_{\text{ps}}^2}\right) \cdot \frac{(x_p - x_s)(y_p - y_s)}{r_{\text{ps}}^2} \right] \\ E_y = \sum_{m_x0}^{M_x} \sum_{m_y0}^{M_y} \frac{\eta \cdot e^{-jkr_{\text{ps}}}}{4\pi r_{\text{ps}}} \left[ I_x(x_s, y_s) \cdot d_x \cdot \left(jk + \frac{3}{r_{\text{ps}}} + \frac{3}{jkr_{\text{ps}}^2}\right) \cdot \frac{(x_p - x_s)(y_p - y_s)}{r_{\text{ps}}^2} + \right. \\ \left. I_y(x_s, y_s) \cdot d_y \cdot \left\{ 2\left(\frac{1}{r_{\text{ps}}} + \frac{1}{jkr_{\text{ps}}^2}\right) \frac{(y_p - y_s)^2}{r_{\text{ps}}^2} - \left(jk + \frac{1}{r_{\text{ps}}} + \frac{1}{jkr_{\text{ps}}^2}\right) \frac{(x_p - x_s)^2 + z_p^2}{r_{\text{ps}}^2} \right\} \right] \\ E_z = \sum_{m_x=0}^{M_x} \sum_{m_y=0}^{M_y} \frac{\eta \cdot e^{-jkr_{\text{ps}}}}{4\pi r_{\text{ps}}} \left[ I_x(x_s, y_s) \cdot d_x \cdot \left(jk + \frac{3}{r_{\text{ps}}} + \frac{3}{jkr_{\text{ps}}^2}\right) \cdot \frac{(x_p - x_s)z_p}{r_{\text{ps}}^2} + \right. \\ \left. I_y(x_s, y_s) \cdot d_y \cdot \left(jk + \frac{3}{r_{\text{ps}}} + \frac{3}{jkr_{\text{ps}}^2}\right) \cdot \frac{(y_p - y_s)z_p}{r_{\text{ps}}^2} \right] \end{cases}$$

Formula 4

Figure 10:
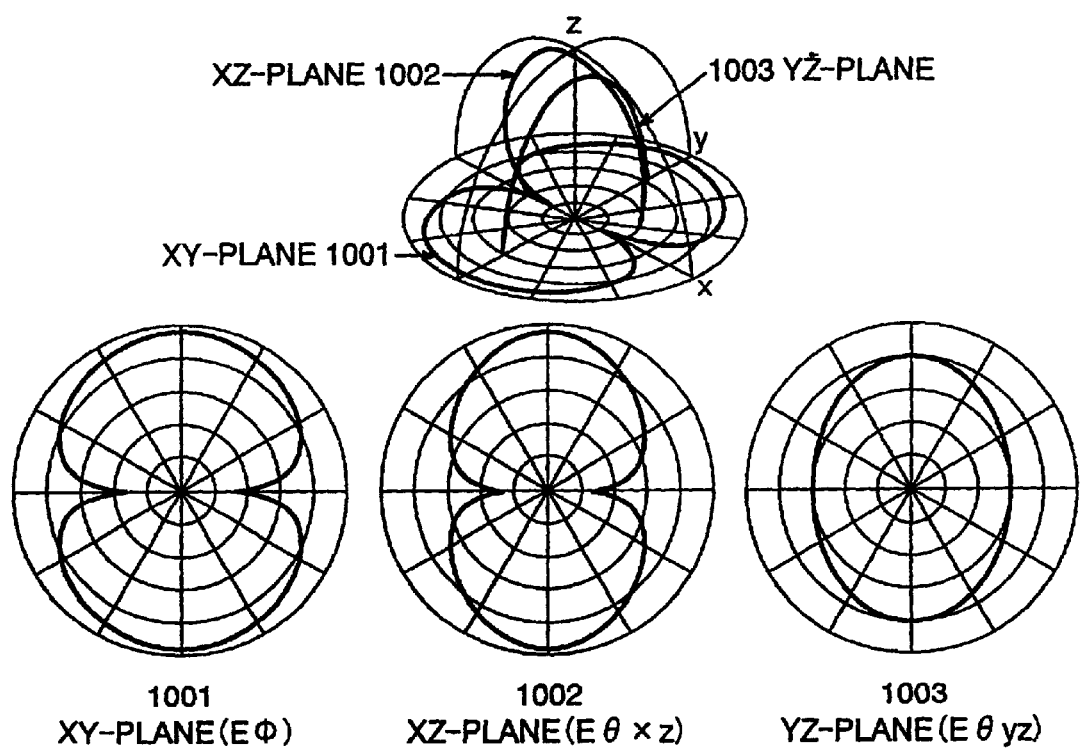
FIG. 10 is a representation of an electric field directivity calculation result.

Furthermore, as represented in formula 5, while the position of the measuring point "P" separated by the distance "r" from the measuring object is moved along a circumferential direction within the xy-plane, the xz-plane, or the yz-plane, an electric field strength is calculated, so that an electric field directivity of either the electronic circuit board or the electronic appliance, which constitute the measuring object, may be obtained In this formula 5, symbol "θ" indicates an angle defined by a straight line for connecting an origin and the measuring point "P" with respect to the Z axis, and symbol "φ" denotes an angle defined by such a straight line with respect to the X axis. This straight line is obtained by projecting the straight line for connecting the origin and the measuring point "P" onto the XY-plane. This calculation result is stored into either the memory of the computer 212 or the storage apparatus 212a. FIG. 9 represents an example of a data file stored in this memory, or the storage apparatus 212a. FIG. 10 indicates a display example of this calculation result, namely shows electric field strengths in an XY-plane 1001, a YZ-plane 1002, and an XZ-plane 1003.

$$r_{ps} = \sqrt{(x_p - x_s)^2 + (y_p - y_s)^2}$$

Formula 5

Subsequently, for example, while the positional information of the measuring point "P" indicative of the maximum electric field strength is saved among the calculated electric field strength "Ep", electric field strengths "Em" at the measuring point "P", which are produced by currents I (xs, ys) of the respective cross points S:103 having the mesh shapes, are calculated in accordance with the above-explained formula 3 (step 503).

Figure 11:
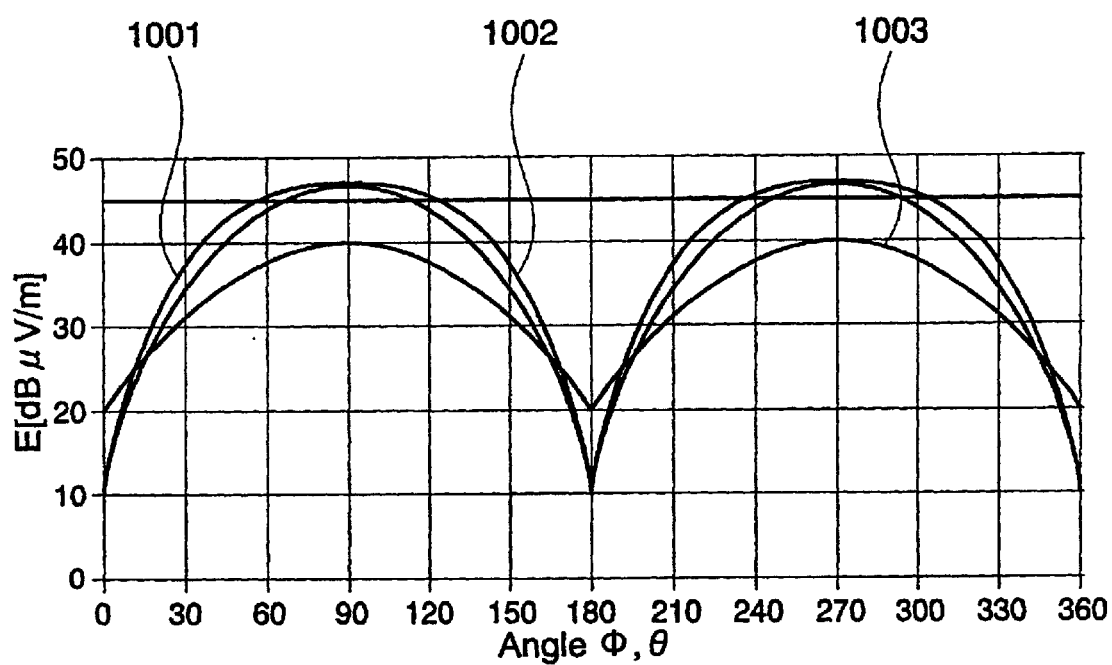
FIG. 11 is a representation of detection results of electric field directivity peak value/regulated value exceeding range.

Since the top major object of the spurious electromagnetic wave generating source searching operation is to suppress the remote (far-distant) electric fields in order to satisfy law regulations and the like, not only such a measuring point "P" having the maximum electric field strength is displayed, but also such an area which cannot satisfy a predetermined value (see FIG. 11) is displayed. Then, the measuring point "P" within this displayed area may be designated by a user, and positional information of this in designated measuring point "P" may be saved in the memory, or the storage apparatus. Alternatively, such a positional information of the measuring point "P" which is designated by the user may be merely saved.

Next, a difference value "ΔE" between the electric field strength "Ep" and the electric field strength "Em" is calculated with respect to each of the cross points S:103 (step 504). Thereafter, a contributing rate "C" for producing a remote electric field is calculated (namely, C=ΔE/Ep) every cross point S:103 based upon formula 6, and then, the calculated distributing rate "C" is displayed (step 505):

$$\begin{cases} C_{E_\phi\{I_x\}}(x_s, y_s) = \frac{E_\phi - \Delta E_\phi\{I_x(x_s, y_s)\}}{E_\phi} : C_{E_\phi\{I_y\}}(x_s, y_s) = \frac{E_\phi - \Delta E_\phi\{I_y(x_s, y_s)\}}{E_\phi} \\ C_{E_\theta\{I_x\}}(x_s, y_s) = \frac{E_\theta - \Delta E_\theta\{I_x(x_s, y_s)\}}{E_\theta} : C_{E_\theta\{I_y\}}(x_s, y_s) = \frac{E_\theta - \Delta E_\theta\{I_y(x_s, y_s)\}}{E_\theta} \end{cases}$$

Formula 6

Figure 12:
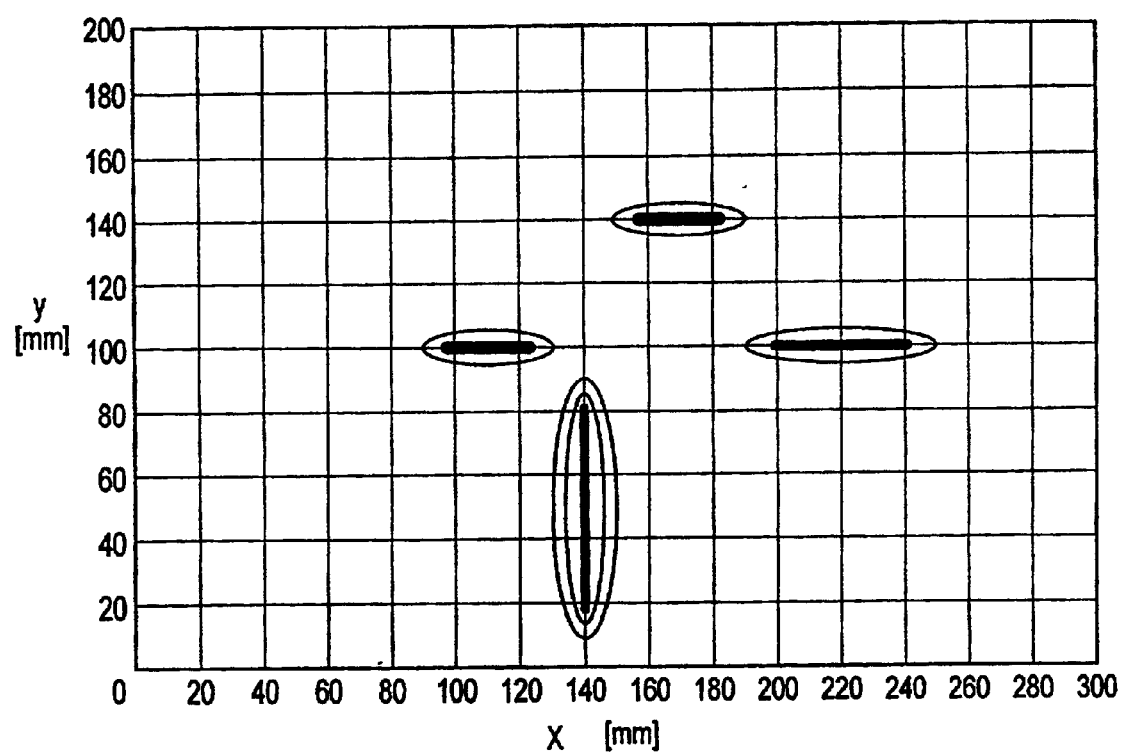
FIG. 12 is a distribution representation of an electric field generation contributing rate.

FIG. 12 shows a representation example of this contributing rate, namely indicates such a contributing rate which is caused by a current Ix in the XY-plane. In an actual case, a contributing rate is preferably displayed by changing a color, or a contrast, depending upon its contributing rate. For the sake of convenient matters, this contributing rate is represented in the form of a contour line in this drawing. As apparent from this drawing, while a current flows along the X direction, a position of Y=100 to 120 [mm] corresponds to such an area which may contribute the generation of the electric field in maximum, namely the area which should be treated in view of the spurious electromagnetic wave generating source. In addition to this representation example, there are a contributing rate representation caused by an Iy component in the XY-plane; a contributing rate representation caused by an Iy component in the YZ-plane; a contributing rate representation caused by an Iz component in the YZ-plane; a contributing rate representation caused by an Iz component in ZX-plane; and also a contributing rate representation caused by an Ix component in the ZX-plane.

With execution of the above-described process operation, it is possible to represent the contributing ratio as such a major reason that the current flowing at the position "S" over either the electronic circuit board or the electronic appliance, which constitute the measuring object, may produce the maximum value of the directivity at the desirable distance "R." It is also possible to judge such a position where the current component is present, and this current may give the highest influence to the designated measuring point "P." In this case, when the contributing rate becomes larger, there is a great probability that the current appeared at this position where the contributing rate becomes larger may cause the remote electric field at the measuring point P to be generated. As a consequence, the user can take any proper measure as to the position where the contributing rate is large based upon this representation.

In this case, since the contributing rate is overlapped with the actual circuit pattern in this representation, there is another effect that the portion where the measure should be actually taken may be clearly indicated. It should also be understood that since there are various methods of calculating the distributing rate "C", even when the contributing rate "C" is represented based upon the electric field strengths "Em" at the respective cross points "S", the difference "ΔE" between the electric field strength "Ep" and the electric field strength "Em", or the ratio of the electric field strength "Ep" to the electric field strength "Em", such a comparing study may be carried out as to which cross point "S" may give the highest influence.

Figure 6:
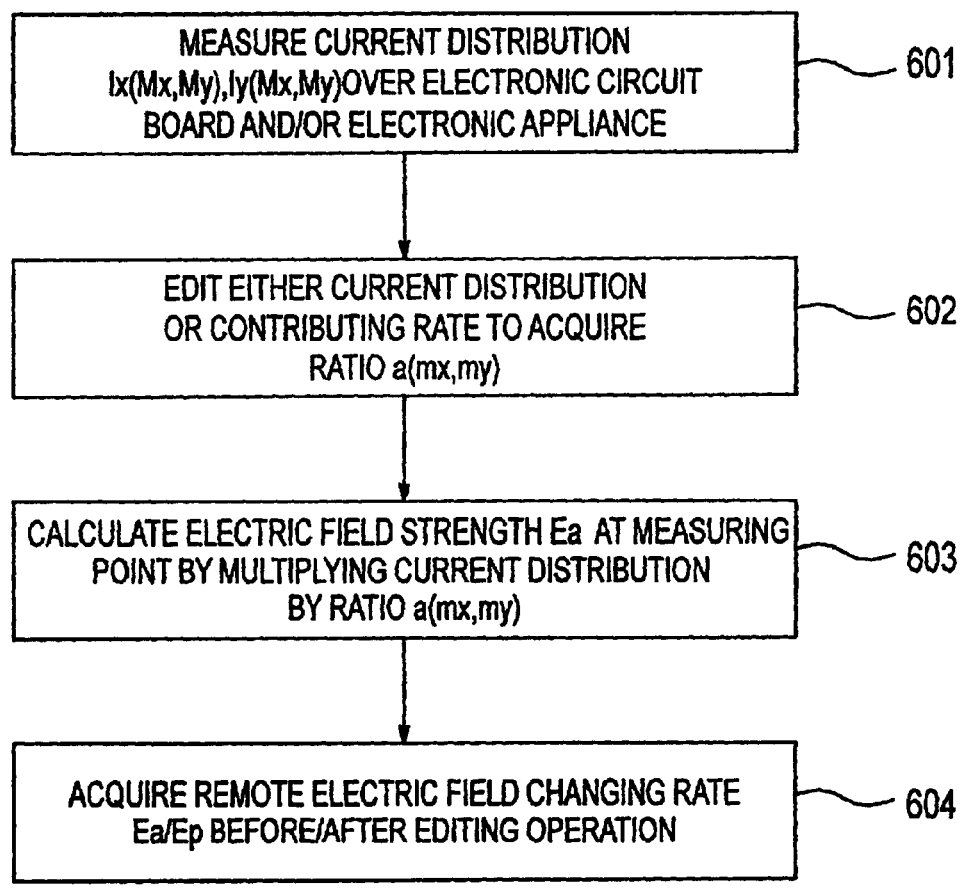
FIG. 6 is a flow chart for describing a calculation of a remote electric field changing rate.

Next, there is an example of such a representation that how degree of an electric field suppressing effect can be achieved in such a case that the measure is taken to a certain area based upon the above-explained contributing rate representation, in other words, in the case that the current distribution over either the electronic circuit board or the electronic appliance, which constitute the measuring object, is changed based on the measure. FIG. 6 is a flow chart for explaining this process operation. Similarly, this process flow operation may be realized in such a manner that a spurious electromagnetic wave generating source editing program which has been previously stored in the storage apparatus 212a of the spurious electromagnetic wave generating source searching apparatus shown in FIG. 2 is executed by the CPU of the computer 212.

First, as explained above, a calculation is made of both a current distribution and a contributing rate over either the electronic circuit board or the electronic appliance, which constitute the measuring object (step 601). Apparent from the foregoing description, the above-explained calculation results may be utilized. Next, either a current distribution (current value) or a contributing rate related to such a portion where the measure is desirably taken is edited (step 602). For example, such an arrangement may be made which is capable of lowering either the current distribution (current value) or the contributing rate in this portion, or which is capable of inputting a ratio "a" which is wanted to be reduced. Then, an electric field strength "Ea" at the measuring point "P" is calculated by way of the same method as the above-explained method in accordance with formula 7 based upon such a value obtained by multiplying either the current distribution (current value) of this portion or the contribution ratio of this portion by this entered ratio "a" (step 603):

$$\begin{cases} E_x = \sum_{m_x 0}^{M_x} \sum_{m_y 0}^{M_y} \frac{\eta \cdot e^{-jkr_{ps}}}{4\pi r_{ps}} [a_x(x_s, y_s) \cdot I_x(x_s, y_s) d_x \cdot \\ \left\{ 2\left(\frac{1}{r_{ps}} + \frac{1}{jkr_{ps}^2}\right) \frac{(x_p - x_s)^2}{r_{ps}^2} - \left(jk + \frac{1}{r_{ps}} + \frac{1}{jkr_{ps}^2}\right) \frac{(y_p - y_s)^2 + z_p^2}{r_{ps}^2} \right\} + \\ a_y(x_s, y_s) \cdot I_y(x_s, y_s) \cdot d_y \cdot \left(jk + \frac{3}{r_{ps}} + \frac{3}{jkr_{ps}^2}\right) \cdot \frac{(x_p - x_s)(y_p - y_s)}{r_{ps}^2} \Bigg] \\ E_y = \sum_{m_x 0}^{M_x} \sum_{m_y 0}^{M_y} \frac{\eta \cdot e^{-jkr_{ps}}}{4\pi r_{ps}} \left[ a_x(x_s, y_s) \cdot I_x(x_s, y_s) d_x \cdot \left(jk + \frac{3}{r_{ps}} + \frac{3}{jkr_{ps}^2}\right) \cdot \right. \\ \frac{(x_p - x_s)(y_p - y_s)}{r_{ps}^2} + a_y(x_s, y_s) \cdot I_y(x_s, y_s) \cdot d_y \cdot \\ \left\{ 2\left(\frac{1}{r_{ps}} + \frac{1}{jkr_{ps}^2}\right) \frac{(y_p - y_s)^2}{r_{ps}^2} - \left(jk + \frac{1}{r_{ps}} + \frac{1}{jkr_{ps}^2}\right) \frac{(x_p - x_s)^2 + z_p^2}{r_{ps}^2} \right\} \Bigg] \\ E_z = \sum_{m_x 0}^{M_x} \sum_{m_y 0}^{M_y} \frac{\eta \cdot e^{-jkr_{ps}}}{4\pi r_{ps}} [a_x(x_s, y_s) \cdot I_x(x_s, y_s) \cdot d_x \cdot \\ \left(jk + \frac{3}{r_{ps}} + \frac{3}{jkr_{ps}^2}\right) \cdot \frac{(x_p - x_s)z_p}{r_{ps}^2} + a_y(x_s, y_s) \cdot I_y(x_s, y_s) \cdot d_y \cdot \\ \left(jk + \frac{3}{r_{ps}} + \frac{3}{jkr_{ps}^2}\right) \cdot \frac{(y_p - y_s)z_p}{r_{ps}^2} \Bigg] \end{cases}$$

Formula 7

Then, this calculation result is compared with the electric field strength "Ep" before being edited (namely, Ea/Ep is calculated), and a remote electric field changing rate before/after the editing operation is outputted (step 604).

In this embodiment mode, the arrangement is made by inputting the ratio "a." Alternatively, while such a numeral value is inputted which is capable of reducing either the current distribution (current value) or the contributing rate related to this portion, or a numeral value which is wanted to be reduced is entered, it may be so arranged that the electric field strength "Ea" at the measuring point "P" is calculated based upon this inputted numeral value.

As a result, since the measure is taken to the specific portion over either the electronic circuit board or the electronic appliance, which constitute the measuring object, it is easily possible to understand how degree of the remote electric field can be suppressed, and also possible to realize the effective measure. More specifically, since it is so arranged that the contributing rate is edited, such a measure capable of solving the difficulty as explained in the prior art can be easily realized. On the other hand, there is a more effective effect in the case that when the current distribution is edited, the effect approximated to the real measurement can be obtained.

On the other hand, with respect to the above-described method of calculating the contributing rate and also the above-explained editing method, the following alternative arrangement may be realized. That is, while a frequency spectrum of a magnetic field is measured, a frequency spectrum of a current distribution may be calculated based upon this frequency spectrum measurement result, and also an electric field strength at a measuring point may be calculated every either a specific frequency or a frequency so as to calculate a contributing rate in each of current elements. An editing operation may be similarly carried out.

Since the contributing rate is displayed in this manner, the source for generating the remote electric field to which the measure should be taken can be readily judged.

What is claimed is:

1. A recording medium including a computer readable program for controlling a computer, said program comprising:

(a) code for calculating a current distribution by using a strength and phase of magnetic field measured from a measuring object;

(b) code for calculating a first electric field strength at a measuring point from said current distribution;

(c) code for calculating a second electric field strength at said measuring point by using a current distribution of a predetermined position on a part of said current distribution of said measuring object; and (d) code for calculating a ratio related to said first electric field strength in association with said second electric field strength.

2. A recording medium according to claim 1, wherein said code for (d) further includes:

code for calculating a difference between said first and second electric field strengths; and code for calculating a ratio of said difference in relation to said first electric field strength.

3. A recording medium according to claim 1, wherein said code for (a) further includes:

code for inner-producing with a measured-magnetic field composite-complex vector and a calculated-magnetic field composite-complex vector.

4. A recording medium according to claim 1, wherein said program further includes:

code for displaying said current distribution with colors in response to said ratio.

5. A recording medium according to claim 4, wherein said code for displaying said current distribution includes code for displaying said current distribution in overlap with an actual circuit pattern.

6. A recording medium according to claim 1, wherein said program further comprising:

code for editing said current distribution to calculate a third electric field strength from an edited current distribution.

7. A recording medium including a computer readable program for controlling a computer, said program comprising:

code for calculating a first electric field strength at a measuring point from a current distribution, said current distribution having been obtained by using a strength and phase of a magnetic field measured from an object;

code for calculating a second electric field strength from said current distribution formed in accordance with externally inputted data; and code for calculating a ratio related to said first electric field strength in association with said second electric field strength.

8. The recording medium according to claim 7, wherein said object is a measuring object.

9. A recording medium including a computer readable program, said program comprising:

code for calculating a current distribution by using a strength and phase of magnetic field measured from an object being measured;

code for calculating a first electric field strength at a measuring point from said current distribution;

code for calculating a second electric field strength at said measuring point by using a current distribution of a predetermined position on a part of said current distribution of said object;

code for calculating a ratio related to said first electric field strength in association with said second electric field strength; and code for calculating a difference between said first and second electric field strengths;

code for calculating a ratio of said difference in relation to said first electric field strength.

* * * * *